United States Patent
Streck et al.

(10) Patent No.: US 7,413,985 B2
(45) Date of Patent: Aug. 19, 2008

(54) METHOD FOR FORMING A SELF-ALIGNED NITROGEN-CONTAINING COPPER SILICIDE CAPPING LAYER IN A MICROSTRUCTURE DEVICE

(75) Inventors: Christof Streck, Coswig (DE); Volker Kahlert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/853,994

(22) Filed: Sep. 12, 2007

(65) Prior Publication Data

US 2008/0132064 A1 Jun. 5, 2008

(30) Foreign Application Priority Data

Nov. 30, 2006 (DE) .................. 10 2006 056 624

(51) Int. Cl.
 *H01L 21/44* (2006.01)
(52) U.S. Cl. .................. 438/687; 438/635; 438/658; 257/E21.582; 257/E21.592
(58) Field of Classification Search ............. 438/687, 438/907, 780, 782, 768, 958, 902, 677, 635, 438/658, FOR. 397, FOR. 395, FOR. 401, 438/FOR. 402, FOR. 404; 257/E21.582, 257/E21.592
See application file for complete search history.

(56) References Cited

U.S. PATENT DOCUMENTS

| 6,350,687 | B1 * | 2/2002 | Avanzino et al. | 438/687 |
| 6,806,191 | B2 | 10/2004 | Zistl et al. | 438/687 |
| 2005/0095843 | A1 | 5/2005 | West et al. | 438/629 |
| 2005/0147762 | A1 | 7/2005 | Dubin et al. | 427/437 |

FOREIGN PATENT DOCUMENTS

| EP | 1 465 245 A2 | 10/2004 |
| EP | 1 670 047 A1 | 6/2006 |

OTHER PUBLICATIONS

Translation of Official Communication from German Patent Office for German Patent Application No. 10 2006 056 624.6-33 dated May 23, 2007.

* cited by examiner

*Primary Examiner*—Matthew S. Smith
*Assistant Examiner*—Julio J. Maldonado
(74) *Attorney, Agent, or Firm*—Williams, Morgan & Amerson, P.C.

(57) ABSTRACT

By forming a copper/silicon/nitrogen alloy in a surface portion of a copper-containing region on the basis of a precursor layer, highly controllable and reliable process conditions may be established. The precursor layer may be formed on the basis of a liquid precursor solution, which may exhibit a substantially self-aligned and self-limiting deposition behavior.

20 Claims, 6 Drawing Sheets

BTA  Cu(I)BTA  1,2,4-Triazole

METHOD FOR FORMING A SELF-ALIGNED NITROGEN-CONTAINING COPPER SILICIDE CAPPING LAYER IN A MICROSTRUCTURE DEVICE

BACKGROUND OF THE INVENTION

1. Field of the Invention

Generally, the present disclosure relates to the formation of integrated circuits, and, more particularly, to the formation of metallization layers including highly conductive metals, such as copper, embedded into a dielectric material, wherein the copper-based metal material receives a nitrogen-containing copper silicide (CuSiN) surface portion for enhancing electromigration performance of the metal.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 μm and less, a limiting factor of device performance is the signal propagation delay caused by the switching speed of the transistor elements. As the channel length of these transistor elements has now reached 50 nm and less, the signal propagation delay is no longer limited by the field effect transistors but is limited, owing to the increased circuit density, by the interconnect lines, since the line-to-line capacitance (C) is increased and also the resistance (R) of the lines is increased due to their reduced cross-sectional area. The parasitic RC time constants therefore require the introduction of a new type of material for forming the metallization layer.

Traditionally, metallization layers, i.e., the wiring layers including metal lines and vias for providing the electrical connection of the circuit elements according to a specified circuit layout, are formed by a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration. For highly sophisticated applications, in addition to using copper and/or copper alloys, the well-established and well-known dielectric materials silicon dioxide (k≈4.2) and silicon nitride (k>5) may be replaced by so-called low-k dielectric materials. However, the transition from the well-known and well-established aluminum/silicon dioxide metallization layer to a copper-based metallization layer possibly in combination with a low-k dielectric material is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines and vias. Typically, in the damascene technique, the dielectric layer is deposited and then patterned for receiving trenches and via openings that are subsequently filled with copper by plating methods, such as electroplating or electroless plating. Moreover, since copper readily diffuses in a plurality of dielectrics, such as silicon dioxide and in many low-k dielectrics, the formation of a diffusion barrier layer at interfaces with the neighboring dielectric material may be required. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration. In order to not unduly reduce the overall conductivity of the metal region, conductive barrier materials are typically used for covering inner sidewall areas of trenches, while dielectric barrier materials are used as capping layers, which may also act as an efficient etch stop material when contacting the metal region by a via from a metal region of a next higher metallization level. For instance, silicon nitride is known as an effective copper diffusion barrier and may be used, for instance, as a capping layer. In other cases, when the moderately high permittivity of silicon nitride is considered inappropriate, nitrogen-enriched silicon carbide (SiCN) is frequently used as a copper diffusion barrier. Despite the diffusion hindering effect of the silicon nitride capping layers and silicon carbide based capping layers, it turns out, however, that copper's resistance against electric current induced material transport (electromigration) or other stress induced material transport effects strongly depends on the characteristics of an interface between the copper-based metal and the adjacent capping layer. Therefore, in sophisticated integrated circuits featuring high current densities, it is generally important to design the interface between the copper-based metal and the capping layer such that a desired high adhesion and thus high performance with respect to electromigration or stress induced mass transport is achieved. In this respect, nitrogen-containing copper silicide (CuSiN) has been identified as an efficient alloy, which may result in a highly stable interface, thereby endowing the corresponding metal region with increased resistance and thus reliability with respect to electromigration and other stress induced mass transport effects.

Hence, in some conventional approaches, the copper surface is exposed to a reactive gas ambient, such as a plasma assisted gas ambient, which may contain silane ($SiH_4$) as a silicon-containing precursor and a nitrogen-containing gas, thereby creating the copper silicide with a specific fraction of nitrogen. Usually, the process for forming the CuSiN material at the exposed copper interface is performed immediately prior to the plasma enhanced chemical vapor deposition (PECVD) of the barrier material, such as silicon nitride, nitrogen-enriched silicon carbide or combinations thereof, wherein respective cleaning processes, such as plasma enhanced processes and the like, may be performed in order to prepare the copper surface for the subsequent formation of the CuSiN alloy and the deposition of the barrier/etch stop material. Thus, a plurality of complex processes may be involved that may interact with the copper surface and therefore result in complex surface conditions, which may therefore require precisely controlled process conditions during the formation of the CuSiN material. It turns out that even minute variations of process conditions may result in significant differences of the composition of the resulting CuSiN material, thereby even deteriorating the characteristics of the copper near the surface. Thus, although CuSiN is a promising candidate for enhancing the performance of copper-based metallization structures, the process is difficult to control, since, for instance, a slight imbalance of the precursor materials may result in non-predictable performance characteristics of the metal line.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for forming a copper alloy or compound including nitrogen and in illustrative embodiments a copper/silicon/nitrogen alloy (CuSiN) in a self-aligned manner within a copper-containing metal region, wherein an enhanced degree of process controllability may be obtained. For this purpose, appropriate concentrations of nitrogen and other species, such as silicon, may be provided above an exposed surface of the copper-containing region by forming a respective precursor material thereon, which may be subsequently subjected to an appropriate decomposition process for providing the corresponding nitrogen and other components for a further reaction with the copper in order to form a well-defined nitrogen-containing alloy, such as a copper/silicon/nitrogen alloy, which may provide superior characteristics with respect to electromigration and other stress induced mass transport effects in sophisticated copper lines of semiconductor devices. In some illustrative embodiments, the respective precursor material may be formed on the basis of a chemical compound providing a substantially self-limiting surface reaction with exposed copper areas, thereby establishing precisely controllable process conditions for the subsequent actual formation of the alloy, such as the copper/silicon/nitrogen alloy. Consequently, a desired degree of precursor concentration, such as silicon and nitrogen concentrations, may be provided by preparing predefined precursor compounds, wherein the precise control of the respective concentrations may actually be achieved during the self-limiting deposition process, thereby "automatically" generating predictable and well-defined process conditions during the subsequent process for initiating a chemical reaction in order to obtain the copper and nitrogen-containing alloy. Thus, by specifically designing the respective precursor compound, the characteristics of the finally obtained alloy, such as the copper/silicon/nitrogen alloy, may be adjusted with high precision, while the corresponding process control is less critical compared to conventional strategies for forming CuSiN, in which typically the respective precursor materials are supplied in a gaseous ambient, for instance based on a plasma assisted process.

According to one illustrative embodiment disclosed herein, a method comprises applying a precursor material on an exposed surface of a copper-containing metal region formed in a first dielectric layer of a semiconductor device, wherein the precursor material contains silicon and nitrogen and forms a self-aligned precursor layer on the exposed surface. The method further comprises activating a chemical reaction of silicon and nitrogen contained in the precursor layer to form a self-aligned copper/silicon/nitrogen alloy in the copper-containing metal region at its surface.

According to another illustrative embodiment disclosed herein, a method comprises providing a precursor material comprising triazole and forming a precursor layer from the precursor material on an exposed surface of a copper-containing region formed in a dielectric layer of a semiconductor device. Finally, the method comprises initiating decomposition of the precursor layer to form a cap layer on the surface.

According to yet another illustrative embodiment disclosed herein, a method comprises forming a copper-containing region in a dielectric layer of a semiconductor device, wherein the copper-containing region comprises an exposed surface. Furthermore, a precursor layer is selectively formed on the exposed surface by applying a precursor solution to the exposed surface, wherein the precursor solution comprises a predefined concentration of silicon and nitrogen. Finally, decomposition of the precursor layer is initiated in order to incorporate silicon and nitrogen into the surface.

BRIEF DESCRIPTION OF THE DRAWINGS

The disclosure may be understood by reference to the following description taken in conjunction with the accompanying drawings, in which like reference numerals identify like elements, and in which.

Figure 1A:
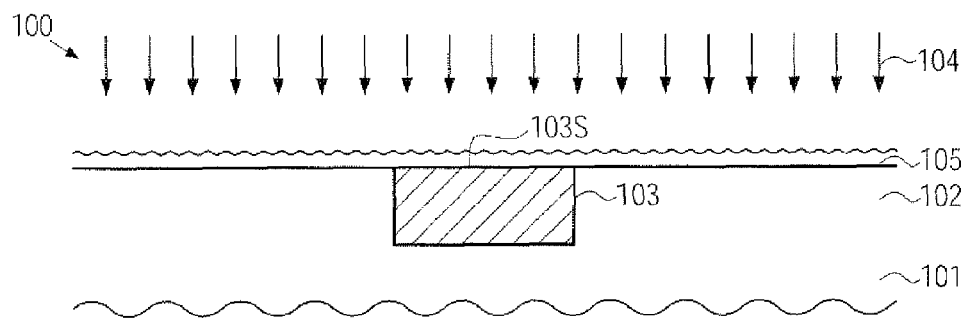
FIGS. 1a-1c schematically illustrate cross-sectional views of a microstructure device during various manufacturing stages in forming a self-aligned copper/silicon/nitrogen alloy on an exposed surface of a copper-containing metal region according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein addresses the problem of reduced process controllability in forming highly efficient nitrogen-containing copper compounds, such as copper/silicon/nitrogen alloys, in copper-containing metal regions of advanced semiconductor devices in that the "supply" of the desired species, such as silicon, and the nitrogen component may be accomplished on the basis of forming a self-aligned precursor material incorporating these components, wherein enhanced control capabilities for forming the respective precursor layer may therefore provide well-defined reaction conditions during the subsequent actual formation of the alloy. Consequently, the corresponding reaction partners may immediately be provided at the copper-containing surface, thereby no longer requiring the establishment of respective gas phases for introducing the corresponding silicon and/or nitrogen components according to conventional strategies for forming CuSiN. Rather, by providing the precursor layer, which thus releases the respective components upon a specified activation step, well-defined conditions may be established for the diffusion of the reactive components into the copper material, wherein also the respective concentrations are substantially fixed by the composition of the precursor layer, thereby achieving stable reaction conditions even if variations with respect to temperature, duration and the like may occur. In some illustrative embodiments, the process for forming the respective precursor layer may be based on a specific chemical compound forming a chemical bond with the copper of the exposed surface, thereby obtaining a substantially self-limiting deposition behavior. Consequently, by appropriately designing or selecting the respective chemical compounds, the degree of surface coverage, the material concentration of the respective components, such as silicon and nitrogen, may be established, wherein also other components may be efficiently introduced into the copper-containing material by incorporating the desired species into the chemical compound used for forming the precursor material. Hence, respective surface characteristics of the metal-containing region may be appropriately adjusted on the basis of well-defined process conditions, wherein the possibility of incorporating desired alloy forming and doping species into the precursor material provides a high degree of flexibility while avoiding undue process limitations during the actual process of initiating the corresponding reaction.

It should be appreciated that the subject matter disclosed herein is highly advantageous in the context of advanced microstructure devices, such as advanced integrated circuits, requiring copper-based metallization structures wherein at least some interfaces of the copper-containing metal with a surrounding dielectric material may require enhanced surface characteristics in view of stress induced transport, such as electromigration, in order to enhance the reliability of the metallization structure, thereby also providing the potential for further device scaling. However, the subject matter disclosed herein may also be applied to any other processes for forming microstructure devices in which the incorporation of respective species in an exposed copper surface in a highly self-aligned and precise manner may be required. Thus, unless specifically pointed out in the specification or the appended claims, the present invention should not be considered as being restricted to metallization structures of semiconductor devices.

FIG. 1a schematically illustrates a cross-sectional view of a microstructure device 100, which may comprise a substrate 101 that may represent any appropriate carrier material for forming therein or thereon microstructure features requiring copper-containing metal regions. For instance, the microstructure device 100 may represent a semiconductor device formed above the substrate 101, which may thus represent a carrier material for having formed thereon an appropriate semiconductor layer for forming therein respective circuit elements, such as transistors, capacitors and the like. The device 100 may include a dielectric layer 102, which may be comprised of any appropriate materials as are typically used for the fabrication of microstructure devices. For instance, the dielectric layer 102 may comprise silicon dioxide, silicon nitride, silicon oxynitride and the like, wherein, in illustrative embodiments, the dielectric layer 102 may comprise a low-k dielectric material, for instance when advanced integrated circuits are considered. The dielectric layer 102 may comprise a copper-containing metal region 103 having one or more exposed surfaces 103S, i.e., respective surfaces that may not be covered by dielectric material or any other materials including a significant portion of non-copper atoms. For example, as previously explained, copper readily diffuses in a plurality of dielectric materials, such as silicon dioxide, and also in a plurality of low-k dielectric materials, thereby requiring respective barrier materials for reliably confining the copper within the metal region 103. Thus, at an interface of the metal region 103 to the dielectric material of the layer 102, appropriate conductive barrier layers may frequently be provided which, for convenience, are not shown in FIG. 1a.

The microstructure device 100 as shown in FIG. 1a may be formed on the basis of any well-established process technique, wherein, for instance, the dielectric layer 102 may be formed on the basis of any appropriate deposition technique and may subsequently be patterned on the basis of lithography, such as photolithography, in combination with appropriate etch techniques in order to form a respective opening, which in sophisticated applications may have lateral dimensions of 100 nm and even less. For instance, a respective trench may be formed in the dielectric layer 102 having a width of 100 nm and even less, while a length of the respective trench may be in the range of several tens of micrometers. Thereafter, any barrier layers may be formed, for instance on the basis of well-established deposition techniques, such as chemical vapor deposition (CVD), physical vapor deposition (PVD), atomic layer deposition (ALD), electrochemical deposition techniques and the like, wherein the corresponding material compositions of the barrier material may be selected with respect to superior adhesion and barrier characteristics. Next, the copper-containing metal may be deposited, for instance on the basis of a wet chemical deposition technique, wherein typically a substantially non-planar surface topography may be created, which may need to be planarized in a subsequent process step. For instance, chemical mechanical polishing (CMP) may frequently be used in order to remove any excess material from the previously performed processes, such as barrier material, copper-containing metal and the like. During the corresponding planarization process, the surface 103S may be exposed.

The metal-containing region 103 may represent a metal line of an advanced semiconductor device, as previously explained, and hence moderately high current densities may occur during the operation of the device 100 which, in combination with thermal stress caused by the heat dissipation, may give rise to a stress induced mass transport within the region 103. Electromigration as one important aspect of stress induced material transport in metal lines to be understood as the migration of the atoms in a metal-containing region, wherein the migration of the metal atoms is caused by the momentum transfer from conducting electrons. In a copper-based metal region, the electromigration is substantially driven by interface and surface diffusion. Consequently, it is of high importance to provide enhanced surface characteristics in order to improve the interface between the metal region 103 and any dielectric material to be formed thereon according to device requirements. In this respect, it has been recognized that the incorporation of specific dopant species into the exposed surface 103S may significantly change the overall electromigration performance after confining the metal region 103 by an appropriate dielectric material. Furthermore, forming a nitrogen-containing copper compound, such as a copper/silicon/nitrogen alloy (CuSiN), at the surface 103S may significantly reduce material diffusion at the corresponding interface, wherein the respective electromigration performance may be adjusted on the basis of the stoichiometric ratio of the various components of the alloy and the like. However, forming a respective compound or alloy with significantly reduced conductivity or even with an insulating characteristic may have a severe impact on the overall conductivity of the region 103, when a significant amount of copper may be consumed by the corresponding process for forming the corresponding alloy in the vicinity of the surface 103S. Hence, a precise control of the respective process may be required, since, for instance, even slight variations of the corresponding layer thickness may therefore result in highly variable conductivity conditions and may also affect the overall electromigration behavior. Consequently, in some illustrative embodiments, the exposed surface 103S may be subjected to a treatment 104, which may comprise the application of an appropriate precursor material 105, for instance, in the form of a liquid solution in which the required species are incorporated in order to form an electromigration enhancing alloy at the surface 103S in a later manufacturing stage. In one illustrative embodiment, the precursor material 105 may have incorporated therein silicon and nitrogen in order to provide the required components for forming a copper/silicon/nitrogen alloy. The precursor material 105 may further be configured such that a surface reaction may occur with copper material in a highly selective manner, while substantially not affecting the material of the layer 102. In this way, a high degree of selectivity may be accomplished so that the treatment 104 may exhibit a self-aligned behavior.

Figure 1B:
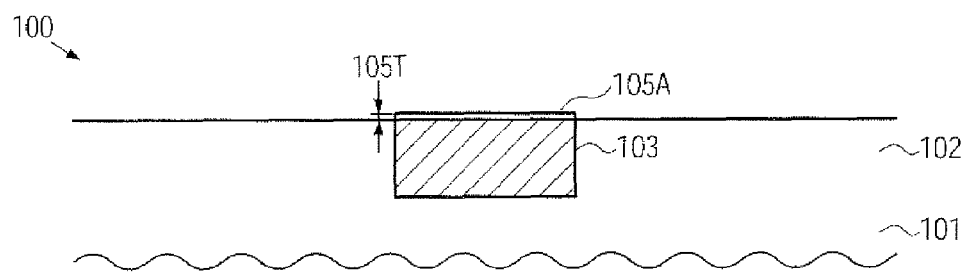

FIG. 1b schematically illustrates the microstructure device 100 in a further advanced manufacturing stage, wherein a corresponding precursor layer 105A may be formed on the surface 103S. The precursor layer 105A may have, in addition to a specified material composition, a well-defined thickness 105T, which may depend on the type of precursor material used, as will be described in more detail later on, while the corresponding process conditions during the treatment 104 may be less critical for obtaining the well-defined characteristics of the layer 105A. Consequently, a well-defined amount of required precursor materials for the actual formation of the specified electromigration enhancing compound may be provided by the precursor layer 105A so that well-defined reaction conditions may be established in a subsequent process step. For example, the thickness 105T may substantially represent a monolayer of the corresponding precursor material and the size of the respective molecules in the precursor material may determine a physical thickness of the layer 105A, as will be shown later on. In this case, the finally obtained concentration of the respective alloy forming species or doping species may also be determined by the size of the individual "carrier molecules" and by the number of atoms of the respective species provided in each of the respective carrier molecules, as will be described later on in more detail.

Figure 1C:
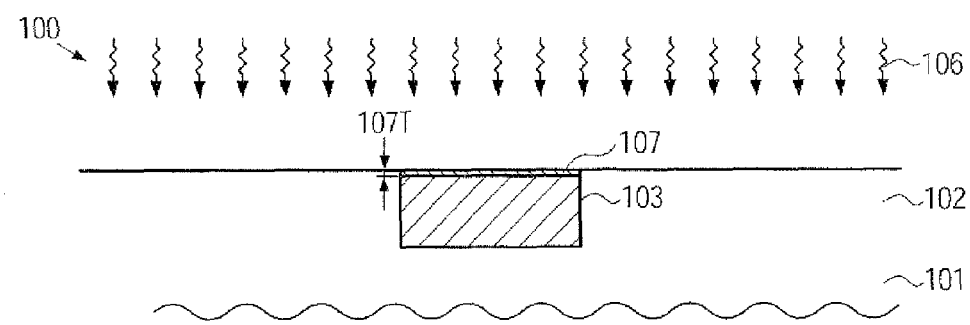

FIG. 1c schematically illustrates the device 100 in a further advanced manufacturing stage, in which the corresponding species, which are provided in a "deactivated" form within the precursor layer 105A, may be "activated" by a corresponding activation process 106, which may be designed as any appropriate process for initiating a substantial decomposition of the precursor layer 105A. For example, the activation process 106 may comprise a heat treatment in order to induce a thermally activated decomposition of the layer 105A, thereby releasing a corresponding species, which may then diffuse into the copper-containing material through the surface 103S forming the desired alloy or compound, such as a copper/silicon/nitrogen alloy. In other illustrative embodiments, the activation treatment 106 may comprise a plasma-based ambient in order to initiate the decomposition of the precursor layer 105A. In still other illustrative embodiments, radiation-induced decomposition may be established during the treatment 106, such as a UV radiation, which may provide sufficient energy in order to cause a significant decomposition of the layer 105A. As previously explained, since a well-defined concentration of the respective alloy forming species is incorporated in the precursor layer 105A and the activation process 106 may provide substantially uniform process conditions across the entire surface 103S, well-defined conditions for the subsequent chemical reaction may also be established, thereby providing a high degree of uniformity for a resulting cap layer 107, which may be formed on the basis of the respective species obtained from the precursor layer 105A. Thus, respective characteristics of the cap layer 107, such as layer thickness, interface uniformity, the uniformity of a concentration of the respective species within the layer 107, may be substantially defined by the precursor layer 105A, thereby providing a high degree of process uniformity and stability.

It should be appreciated that the process sequence including the processes 104 and 106 may include any intermediate process, which may be performed in different process tools. For example, the precursor layer 105A may be formed at any appropriate manufacturing stage, for instance immediately upon exposing the surface 103S or after any other processes, such as an anneal process for adjusting the crystalline structure of the metal region 103, wherein the process 104 may be preceded by a respective cleaning process in order to remove any contaminants, if desired. Thereafter, the device 100 may be processed in accordance with device requirements, wherein the precursor layer 105A may even provide a desired degree of passivation, thereby reducing the tendency for creating additional corrosion on the exposed surface 103S. At any appropriate manufacturing stage, for instance immediately prior to the deposition of a further dielectric material, the process 106 may, in some illustrative embodiments, be performed in the respective process sequence without interrupting the vacuum conditions, thereby further enhancing process performance. In other cases, the activation process 106 may be performed in combination with a respective anneal process, which may be required for adjusting the crystal structure in the region 103. Consequently, the separation of the process of forming the cap layer 107 into two relatively independent process steps may provide enhanced process uniformity, as is explained above and as will be explained later on in more detail, and also provides increased process flexibility of the overall manufacturing process, thereby reducing process complexity compared to conventional approaches for forming a copper/silicon/nitrogen cap layer.

Figure 1D:
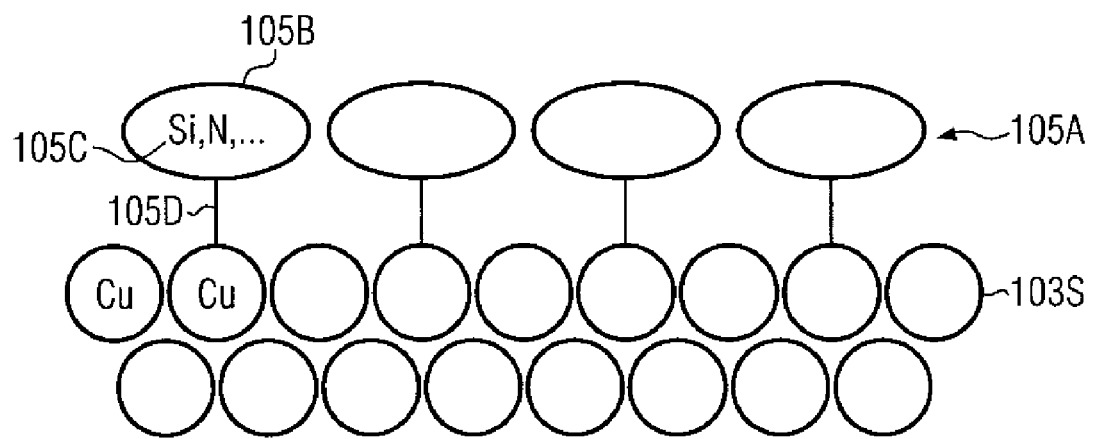
FIGS. 1d-1e schematically illustrate a corresponding mechanism for forming a substantially self-limiting precursor layer on a copper surface with a subsequent decomposition of the precursor layer according to still further illustrative embodiments.

FIG. 1d schematically illustrates the situation at the surface 103S after forming the precursor layer 105A. As shown, the precursor layer 105A may be comprised of respective molecules 105B which may act as carriers for respective species 105C required for forming the desired material in the cap layer 107. In illustrative embodiments, the species 105C comprise at least silicon and nitrogen in order to obtain copper/silicon/nitrogen alloys. The molecules 105B may be designed such that a chemical bond 105D with a copper atom available at the surface 103S may be created, while the molecules 105B may be substantially "inert" with respect to non-metallic species, as may be encountered at the respective surface portions of the dielectric layer 102. Consequently, the characteristics of the molecules 105B may provide the desired feature of self-alignment and also for self-limiting the corresponding deposition process, since the molecules 105B may not be able to diffuse into the surface 103S, thereby restricting any available reaction partners to the respective copper atoms available at the surface 103S. Furthermore, the degree of coverage or saturation of the layer 105A may then depend on the size of the individual molecules 105B so that, for a given number of species atoms 105C, the corresponding concentration may be adjusted by appropriately modifying the size of the molecules 105B.

Figure 1E:
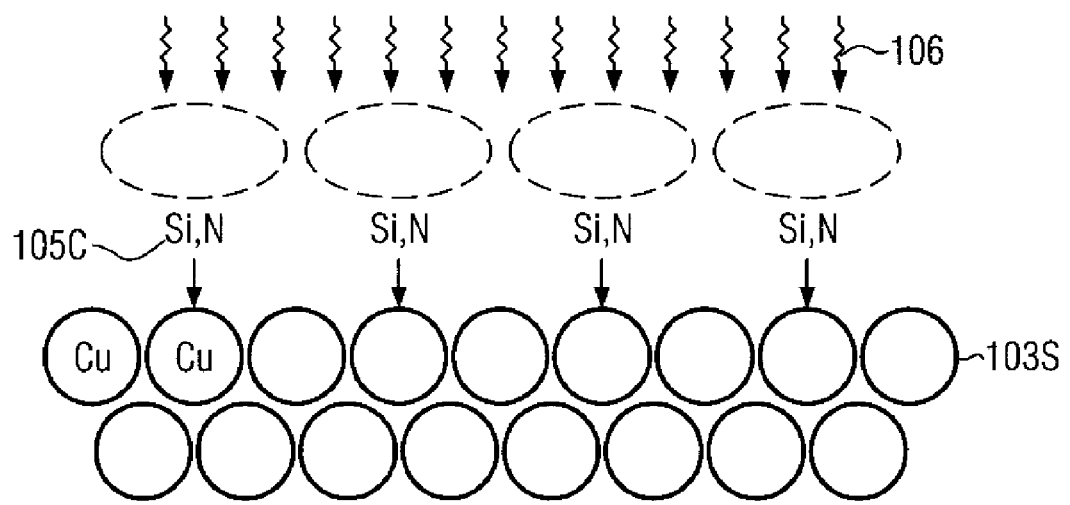

FIG. 1e schematically illustrates the situation during the activation process 106, wherein the activation energy obtained during the process 106 may result in a decomposition of the respective molecules 105B, thereby liberating the species 105C, which may now diffuse into the surface 103S and may undergo a corresponding chemical reaction with the copper atoms, thereby forming the desired alloy or compound, such as a copper/silicon/nitrogen alloy. Consequently, during the activation process 106, a well defined concentration of species 105C is provided immediately at the surface 103S, thereby making the corresponding process for forming the cap layer 107 relatively insensitive to any process variations. That is, in the first step for forming the precursor layer 105A, the concentration of the species 105C is substantially determined by the characteristics of the molecules 105B, which may be provided within well controllable process conditions. Furthermore, the process of adhering the molecules 105B to the surface 103S may also take place within well controllable process windows. Finally, the actual chemical reaction of the species 105C with the copper near the surface 103S may progress in a substantially uniform manner with a significantly lesser restricted process window compared to conventional techniques, in which the corresponding cap layer may be formed on the basis of one or more reactive gas ambients, requiring a tight control of the respective process parameters, such as flow rates, temperature, pressure and the like.

Figure 1F:
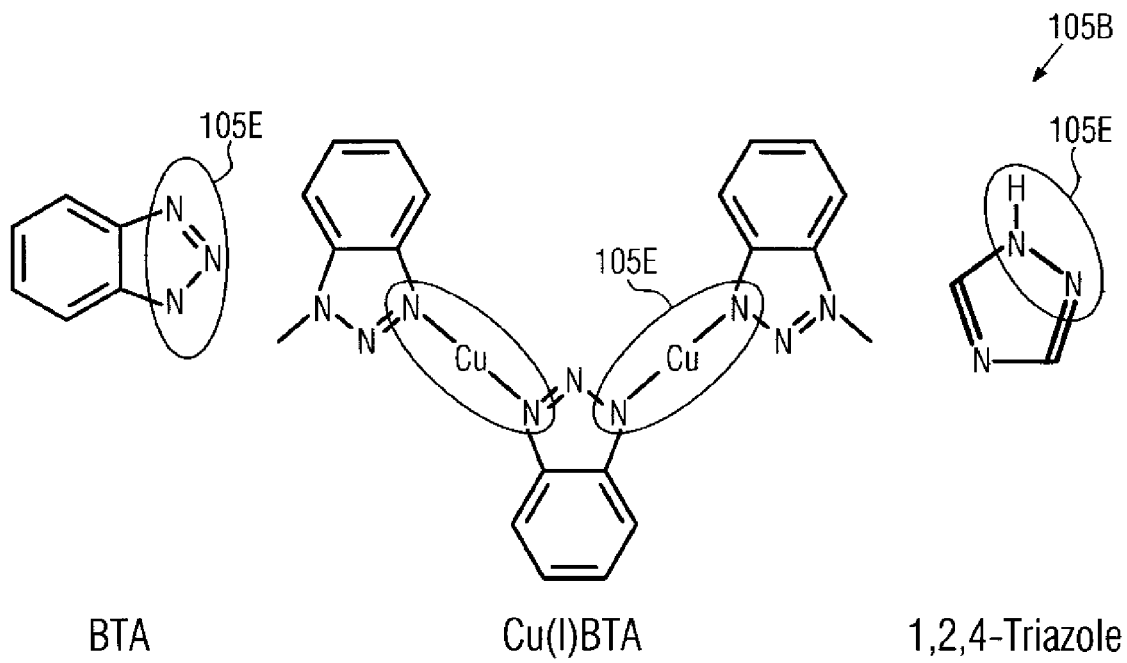
FIG. 1f schematically illustrates a chemical formula for representing appropriate base materials for forming precursor layers according to still other illustrative embodiments.

FIG. 1f schematically illustrates the molecules 105B according to one illustrative embodiment. As shown, the molecules 105B may be based on a triazole component, which may be used in various combinations, for instance in the form of benzene triazole (BTA) and the like. The corresponding parts of the molecules 105B responsible for creating respective bonds to copper are illustrated as 105E. Hence, these molecules may be efficiently used for obtaining the desired degree of selectivity with respect to a copper-containing surface, as it is well known that for instance BTA and triazole compounds may form monomolecular layers on exposed copper surfaces. Thus, this mechanism may be advantageously used in illustrative embodiments in order to form the respective precursor layer 105A, wherein the corresponding molecules may be appropriately designed so as to contain the desired species 105C.

Figure 1G:
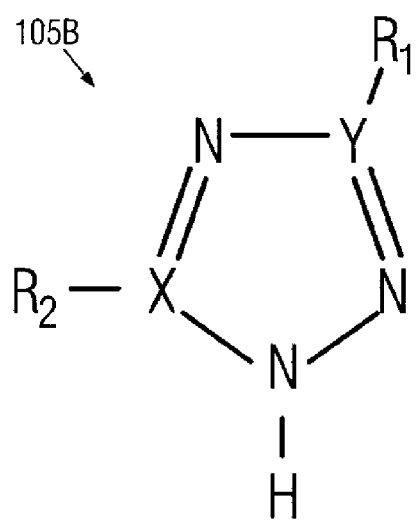
FIG. 1g schematically illustrates the chemical representation of an appropriate compound for forming a precursor material and for adjusting the respective characteristics of the copper/silicon/nitrogen alloy according to further illustrative embodiments.

FIG. 1g schematically illustrates one of the molecules 105B according to one illustrative embodiment disclosed herein. As shown, the molecule 105B may comprise respective components X, Y connected to the corresponding nitrogen atoms of the basic triazole molecule. These components X, Y may be readily replaced with carbon or silicon, depending on the process requirements. For instance, if a moderately high silicon concentration may be desirable in the precursor layer 105A, both components X and Y may be replaced with a silicon atom. Furthermore, the molecule 105B may comprise respective groups R1 and R2, which may be respective "species" molecules containing any appropriate material, such as silicon, carbon, sulfur, hydrogen, phosphorous and the like. Consequently, by providing a respective molecule of the desired species, any appropriate material may be incorporated into the copper surface. For instance if a specific dopant species may have to be incorporated into the copper surface 103S, R1 or R2 or both may be replaced with a corresponding molecule. The functional groups R1 and R2 may also represent metal complexes, when a corresponding presence of a respective metal species may be desirable in view of the surface characteristics. In other cases, as previously explained, the individual size of the molecule 105B may be appropriately designed on the basis of the respective groups R1 and R2 which may then not necessarily have a function for providing respective species for being incorporated into the copper surface 103S, but may adjust the degree of coverage or concentration of respective molecules 105B that may be bonded to the surface 103S. Thus, even with a moderately simple molecule, such as the triazole based molecule 105B as shown in FIG. 1g, a wide variety of different molecules 105B may be designed and, thus, a corresponding variety of precursor layers 105A may be generated on the basis of well controllable process conditions. As previously explained, the hydrogen atom in the molecule 105B may be replaced by copper when applying the corresponding precursor material during the process 104, thereby providing the self-aligned and self-limiting deposition behavior. If, on the other hand, increased concentrations of respective species may be desirable or if a plurality of identical layers may be required in the precursor layer 105A, the group R1 may be appropriately designed so as to undergo a corresponding chemical bond with another one of the molecules 105B.

Figure 1H:
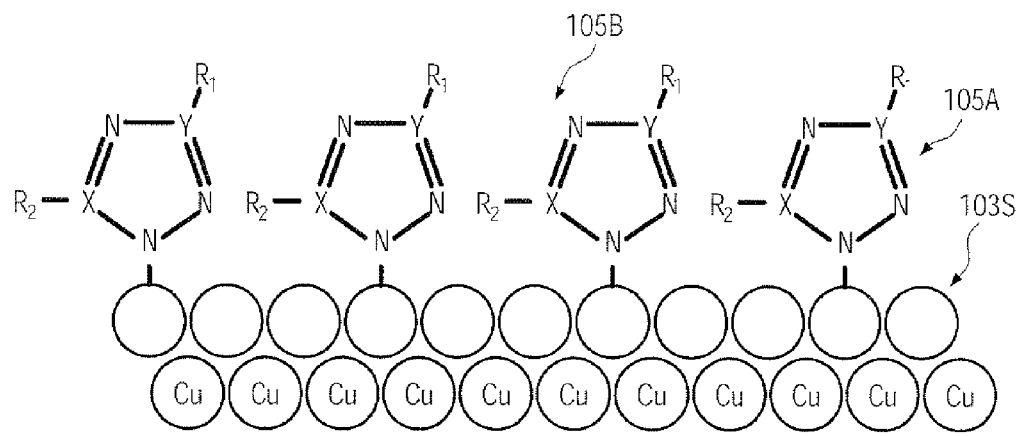
FIG. 1h schematically illustrates a respective precursor layer using the compound of FIG. 1g.

FIG. 1h schematically illustrates the precursor layer 105A, when formed on the basis of the molecules 105B as shown in FIG. 1g. As illustrated, a substantially monomolecular layer may be formed on the basis of respective chemical bonds, in which the hydrogen atom may be replaced by a corresponding copper atom within the surface 103S. Furthermore, the size of the molecules 105B, adjusted for instance by the groups R1 and R2, may substantially determine the concentration or degree of coverage of the surface 103S, wherein the ph value of the respective liquid solution 105 may also have an influence on the finally obtained concentration of molecules 105B. Hence, the respective parameters for determining the characteristics of the precursor layer 105A may be defined by well controllable parameters, such as a type of molecules of the groups R1 and R2 and the local ph value. Consequently, the finally obtained thickness of the cap layer 107 may also be determined on the basis of these process parameters while moderate process variations during the activation process 106 may be less critical.

Similarly, as previously explained, any other material, such as dopant species, to be incorporated into the surface 103S may be provided with a high degree of uniformity, since the concentration of these components is also substantially determined by the characteristics of the precursor layer 105A. Furthermore, by providing a process technique for forming a precursor layer in a highly controllable manner, for instance of a self-limiting deposition process on the basis of an appropriate liquid solution, the corresponding reaction conditions of the subsequent incorporation of the respective species into the copper-containing surface may be established with a high degree of uniformity and controllability.

With reference to FIGS. 2a-2e, further illustrative embodiments will now be described in more detail, in which a copper-containing metal region may receive an enhanced interface characteristic on the basis of a two step process using a precursor layer described above.

Figure 2A:
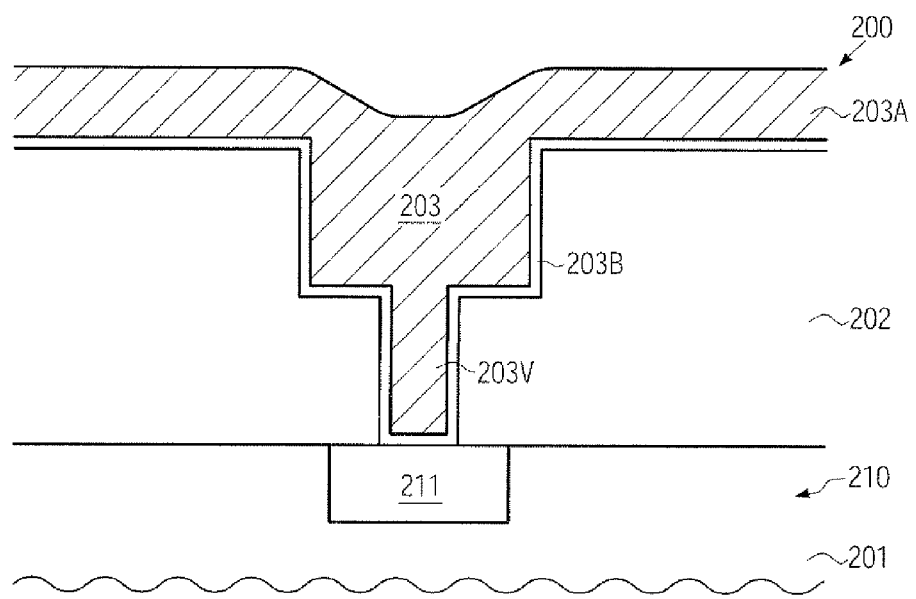
FIGS. 2a-2e schematically illustrate cross-sectional views of various manufacturing stages in forming a copper-based metallization structure for an advanced semiconductor device with enhanced electromigration behavior according to illustrative embodiments disclosed herein.

FIG. 2a schematically illustrates a semiconductor device 200 comprising a substrate 201 having formed thereon a corresponding material layer 210 in which may be formed respective circuit elements, such as transistors, capacitors and the like. For convenience, any such circuit elements are not shown in FIG. 2a. Furthermore, the material layer 210 may comprise a conductive region 211, which may represent a metal-containing region of a metallization level, a contact portion of a semiconductor device and the like. Furthermore, the device 200 may comprise a metallization structure including a dielectric layer 202 comprising a copper-containing metal region 203. In the embodiment illustrated in FIG. 2a, the metal region 203 may represent a metal line including a respective via 203V connecting to the conductive region 211. Furthermore, the metal region 203 may comprise at sidewall portions thereof a barrier material 203B having any appropriate composition for providing the desired barrier and adhesion characteristics, as is previously explained. Furthermore, at this manufacturing stage, excess material 203A may be formed above the dielectric layer 203.

A typical process flow for forming the semiconductor device 200 as shown in FIG. 2a may comprise the following processes. After forming any circuit elements within the layer 210, for instance of well-established semiconductor processing techniques, the dielectric layer 203 may be formed above the layer 210 on the basis of any appropriate manufacturing technique. For example, in sophisticated applications, low-k dielectric materials may be used, for example in combination with conventional dielectrics, such as fluorine doped silicon dioxide and the like, in order to form the layer 202. It should be appreciated that additional etch stop layers may also be incorporated into the layer 202, if appropriate. Thereafter, the dielectric material of the layer 202 may be patterned on the basis of appropriate techniques including, for instance, lithography and anisotropic etch processes. It should be appreciated that a plurality of different manufacturing regimes are well established in the art and may be used for appropriately patterning the dielectric layer 202. Thereafter, the barrier layer 203B, if required, may be formed on the basis of any appropriate deposition process, followed by the deposition of the copper-containing material in order to reliably fill the region 203, thereby also producing the excess material 203A. The material 203A may be removed, at least partially, by an appropriately designed CMP process during which the surface topography may be planarized and an exposed surface of the region 203 may be obtained. During and after the CMP process, respective material residuals may have to be removed, for instance on the basis of a correspondingly designed rinse process, wherein, in one illustrative embodiment, the application of a respective rinsing solution may comprise the provision of an appropriately designed precursor material as is for instance described with reference to FIGS. 1d-1h, thereby creating a respective precursor layer on the exposed surface of the region 203 in a self-aligned manner. Subsequently, a further rinse process on the basis of, for instance, de-ionized water may be performed to remove residuals of the precursor solution and possibly any further contaminants. In other illustrative embodiments, the removal of the excess material 203A may be performed according to a conventional process sequence and, thereafter, the metal region 203 may be appropriately annealed in order to adjust the crystalline structure therein. After the CMP process, a passivation layer may be formed on the exposed copper surface, if required.

Figure 2B:
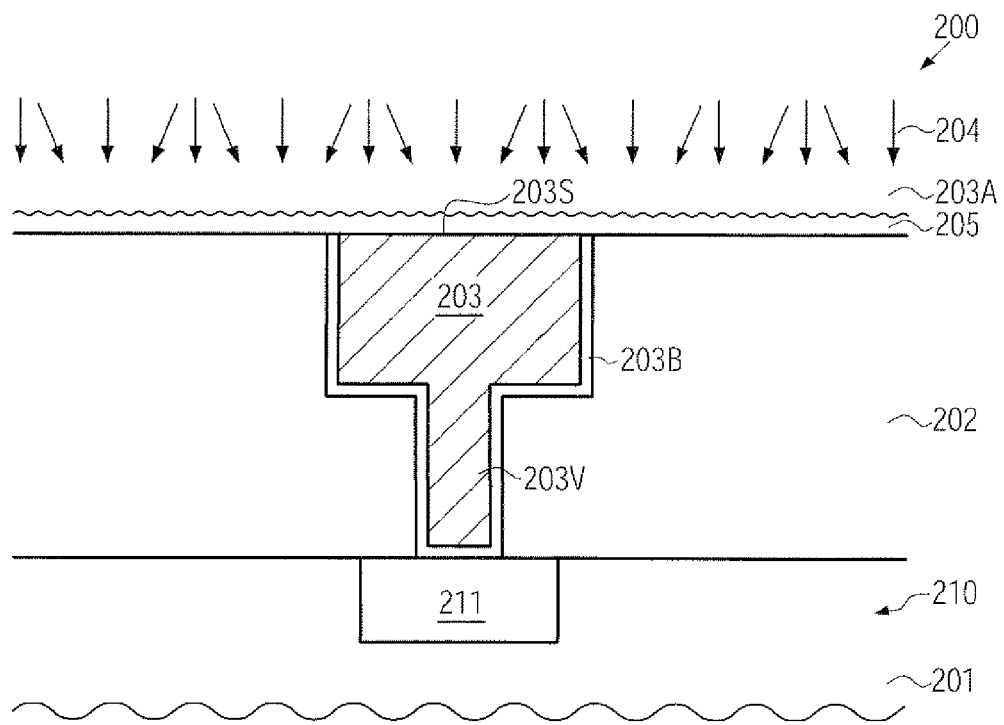

FIG. 2b schematically illustrates the semiconductor device 200 during a treatment 204, in which a precursor solution 205 may be applied to the exposed surface 203S of the region 203. As described above, the corresponding treatment 204 may be performed immediately after the end of the planarization process, for instance on the basis of a corresponding rinsing process, or may be performed at any later stage, for instance after a corresponding anneal process for adjusting the crystallinity of the metal region 203. In one illustrative embodiment, the precursor material may include silicon and nitrogen on the basis of an appropriate carrier molecule, as is for instance described with reference to FIGS. 1d-1h. In still other illustrative embodiments, the precursor material 205 may include, in addition to nitrogen, appropriate dopant species or metal species, depending on the desired characteristics of the surface 203S.

Figure 2C:
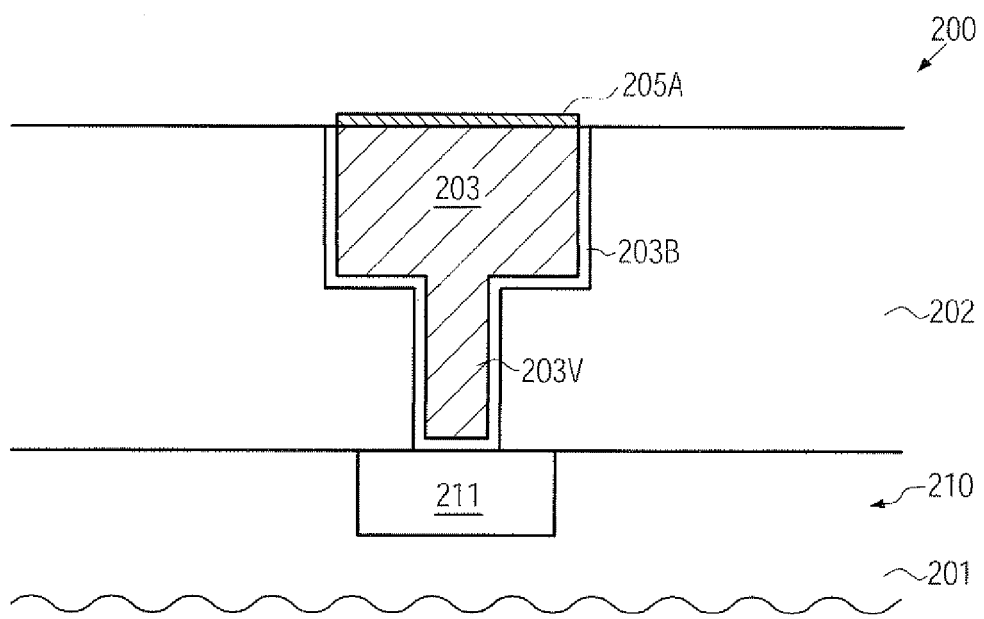

FIG. 2c schematically illustrates the semiconductor device 200 with a precursor layer 205A selectively formed on the exposed surface 203S, wherein the precursor layer 205A may have well defined characteristics with respect to thickness, concentration of surface enhancing species and the like, as is previously explained with reference to the precursor layer 105.

Figure 2D:
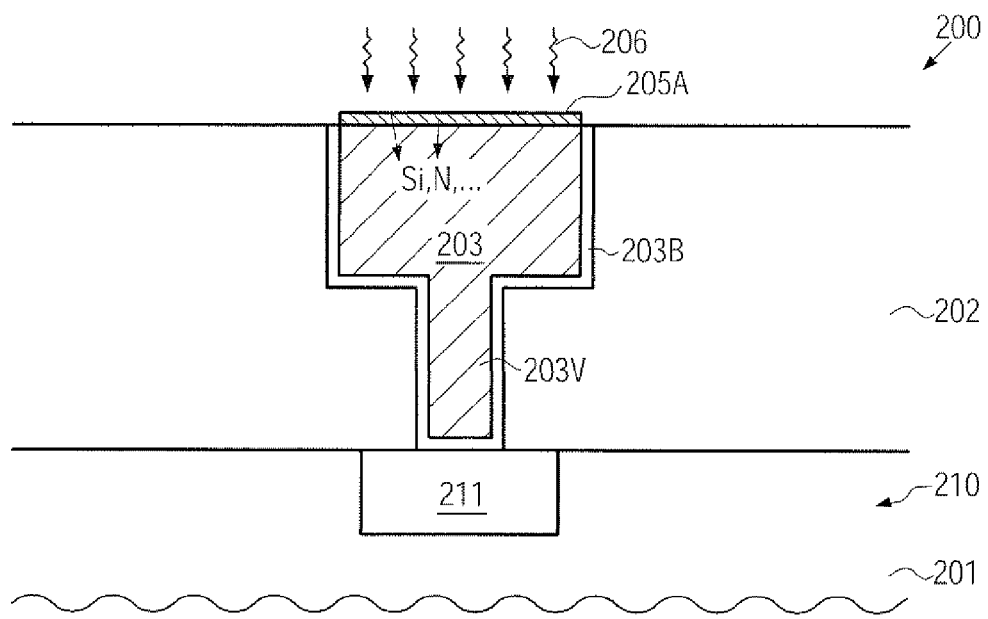

FIG. 2d schematically illustrates the semiconductor device 200 in a further advanced manufacturing stage, in which an activation process may be performed in order to initiate the decomposition of the precursor layer 205A as is previously described. In one illustrative embodiment, the activation process 206 may be performed on the basis of process parameters such as temperature and duration appropriate for obtaining the desired degree of crystallinity in the metal region 203. In other illustrative embodiments, the activation process 206 may be performed as an independent process step using elevated temperatures and/or energetic radiation, such as UV radiation, and/or reactive gas ambient, which may be based on a plasma, in order to efficiently initiate the decomposition of the precursor layer 205A and to define appropriate process conditions for initiating a corresponding chemical reaction between the species contained in the molecules and the exposed copper surface.

Figure 2E:
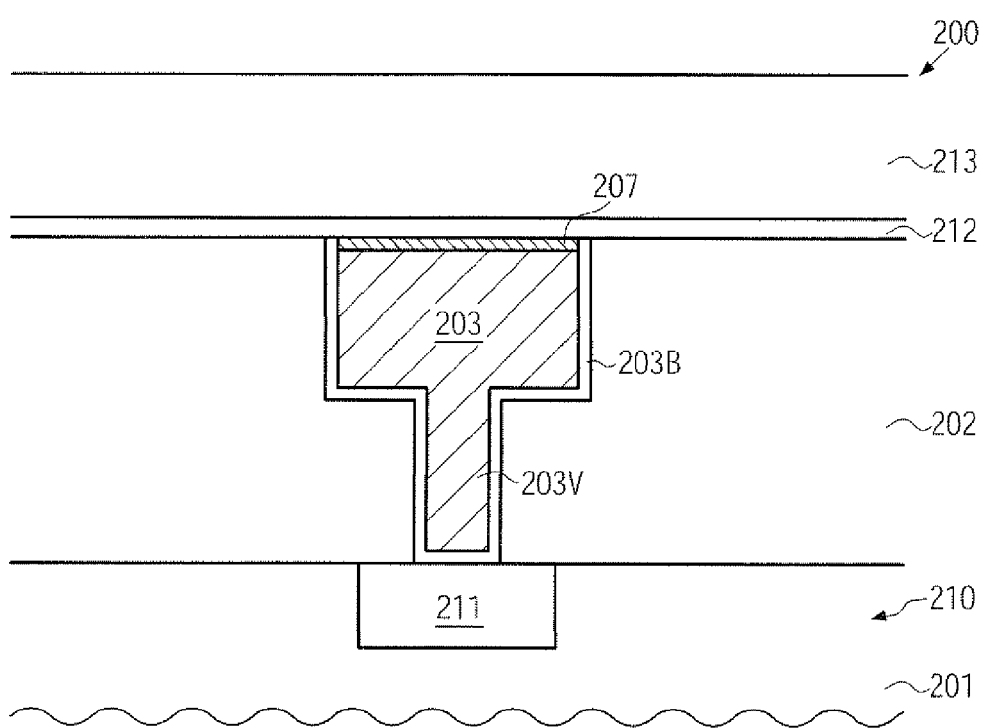

FIG. 2e schematically illustrates the semiconductor device 200 in a further advance manufacturing stage, wherein a well defined cap layer 207, as created during the process 206, is formed in the metal-containing region 203, thereby imparting enhanced surface characteristics, for instance in view of electromigration, to the surface 203S. Furthermore, at this manufacturing stage, a dielectric layer 212 may be formed above the layer 202 and on the cap layer 207. For instance, the dielectric layer 212 may be comprised of well established barrier and etch stop materials, such as silicon nitride, silicon carbide, nitrogen enriched silicon carbide or any combination thereof. Hence, the dielectric layer 212 may provide the desired degree of copper confinement of the copper-containing region 203 and the cap layer 207 may provide the enhanced interface characteristics in order to significantly reduce electromigration of the copper-containing region 203. Furthermore, the device 200 may comprise a further material layer, such as a dielectric layer 213, that may be used for forming further metallization levels, depending on the device requirements.

Consequently, the formation of the cap layer 207 may be performed in a two step process, wherein each step may be performed at any appropriate manufacturing stage, thereby providing a high degree of flexibility in forming the device 200. In some illustrative embodiments, the last step, i.e., the activation process 206, may be combined with a process sequence for forming the dielectric layer 212, thereby providing a highly efficient process flow with a high degree of compatibility with conventional strategies, wherein, however, control of the characteristics of the cap layer 207 may be significantly enhanced compared to conventional strategies. Similarly, the first step may be incorporated into standard process steps for treating the copper regions 203, for instance by annealing and the like, thereby also efficiently reducing any additional process complexity. Thus, due to the high degree of controllability and the wide range of adaptability of the process sequence for forming the cap layer 207, appropriate copper alloys, such as copper/silicon/nitrogen alloys, may be efficiently used for enhancing the electromigration behavior in a highly stable and controllable manner.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    applying a precursor material to an exposed surface of a copper-containing metal region formed in a first dielectric layer of a semiconductor device, said precursor material containing nitrogen and forming a self-aligned precursor layer on said exposed surface; and
    activating a chemical reaction of nitrogen contained in said precursor layer to form a self-aligned copper compound in said copper-containing metal region at said surface.

2. The method of claim 1, further comprising preparing said precursor material on the basis of at least one of triazole and a compound thereof.

3. The method of claim 1, wherein said precursor material comprises at least one dopant species for enhancing surface characteristics of said copper-containing metal region with respect to stress induced mass transport.

4. The method of claim 1, wherein said precursor material comprises silicon to form said copper-containing compound in the form of a copper/silicon/nitrogen alloy.

5. The method of claim 1, further comprising forming said exposed surface by a chemical mechanical polishing (CMP) process, wherein said precursor material is applied when removing residues of said CMP process.

6. The method of claim 5, further comprising annealing said copper-containing metal region for adjusting a crystalline structure in said copper-containing metal region, wherein said annealing is performed in the presence of said precursor layer.

7. The method of claim 1, further comprising annealing said copper-containing region to adjust a crystalline structure prior to applying said precursor material.

8. The method of claim 1, wherein activating said chemical reaction comprises performing at least one of a plasma treatment, a heat treatment and a radiation based treatment.

9. The method of claim 4, wherein activating said chemical reaction and forming a second dielectric layer are performed as in situ processes.

10. A method, comprising:
    providing a precursor material comprising triazole and alloy species;
    forming a precursor layer from said precursor material on an exposed surface of a copper-containing region formed in a dielectric layer of a semiconductor device; and
    initiating decomposition of said precursor layer to form a cap layer on said surface on the basis of said alloy species.

11. The method of claim 10, wherein said precursor material comprises at least one dopant species to be incorporated into said cap layer.

12. The method of claim 10, further comprising forming said exposed surface by a chemical mechanical polishing (CMP) process, wherein said precursor material is applied during rinsing said surface for removing residues of said CMP process.

13. The method of claim 10, wherein said alloy species comprises silicon.

14. The method of claim 13, wherein initiating said decomposition of said precursor material and forming at least one layer of said dielectric layer are performed as an in situ process.

15. The method of claim 10, further comprising annealing said copper-containing region for adjusting a crystalline structure, wherein said annealing is performed in the presence of said precursor layer to initiate the decomposition thereof.

16. The method of claim 10, further comprising annealing said copper-containing region prior to forming said precursor layer.

17. The method of claim 10, wherein initiating decomposition of said precursor layer comprises at least one of a heat treatment, a plasma assisted process and a radiation assisted process.

18. A method comprising:
forming a copper-containing region in a dielectric layer of a semiconductor device, said copper-containing region comprising an exposed surface;
selectively forming a precursor layer on said exposed surface by applying a precursor solution to said exposed surface, said precursor solution comprising a predefined concentration of silicon and nitrogen; and
initiating decomposition of said precursor layer to incorporate silicon and nitrogen into said surface.

19. The method of claim 18, wherein applying said precursor solution comprises applying said solution in two or more individual process steps.

20. The method of claim 18, wherein said precursor solution is prepared on the basis of a material forming a compound on copper in a self-limiting manner.

* * * * *